(12) United States Patent
Loubet et al.

(10) Patent No.: US 11,670,554 B2
(45) Date of Patent: Jun. 6, 2023

(54) METHOD TO CO-INTEGRATE SIGE AND SI CHANNELS FOR FINFET DEVICES

(71) Applicant: Bell Semiconductor, LLC, Bethlehem, PA (US)

(72) Inventors: Nicolas Loubet, Guilderland, NY (US); Prasanna Khare, Schenectady, NY (US); Qing Liu, Irvine, CA (US)

(73) Assignee: Bell Semiconductor, LLC, Bethlehem, PA (US)

( * ) Notice: Subject to any disclaimer, the term of this patent is extended or adjusted under 35 U.S.C. 154(b) by 38 days.

(21) Appl. No.: 16/426,579

(22) Filed: May 30, 2019

(65) Prior Publication Data
US 2019/0279912 A1 Sep. 12, 2019

Related U.S. Application Data

(60) Continuation of application No. 15/813,071, filed on Nov. 14, 2017, now Pat. No. 10,340,195, which is a continuation of application No. 14/969,393, filed on Dec. 15, 2015, now Pat. No. 9,847,260, which is a division of application No. 13/907,613, filed on May 31, 2013, now Pat. No. 9,685,380.

(51) Int. Cl.
| | |
|---|---|
| H01L 27/092 | (2006.01) |
| H01L 21/8238 | (2006.01) |
| H01L 21/3065 | (2006.01) |
| H01L 21/308 | (2006.01) |

(52) U.S. Cl.
CPC .... *H01L 21/823807* (2013.01); *H01L 21/308* (2013.01); *H01L 21/3065* (2013.01); *H01L 21/823821* (2013.01); *H01L 21/823878* (2013.01); *H01L 27/0922* (2013.01)

(58) Field of Classification Search
CPC ......... H01L 21/823807; H01L 21/3065; H01L 21/308; H01L 21/823821; H01L 21/823878; H01L 27/0922
USPC .......................... 257/206, 369; 438/478, 222
See application file for complete search history.

(56) References Cited

U.S. PATENT DOCUMENTS

| | | | |
|---|---|---|---|
| 5,268,324 A | 12/1993 | Aitken et al. | |
| 9,847,260 B2 | 12/2017 | Loubet et al. | |
| 2003/0206437 A1 | 11/2003 | Diorio et al. | |
| 2005/0242395 A1 | 11/2005 | Chen et al. | |
| 2011/0227165 A1 | 9/2011 | Basker et al. | |
| 2013/0168771 A1* | 7/2013 | Wu ..................... | H01L 29/1054 257/E21.632 |
| 2013/0193514 A1 | 8/2013 | Loubet et al. | |
| 2013/0256835 A1 | 10/2013 | Di Sarro et al. | |

* cited by examiner

*Primary Examiner* — Hrayr A Sayadian
(74) *Attorney, Agent, or Firm* — Mendelsohn Dunleavy, P.C.; Steve Mendelsohn

(57) ABSTRACT

A method for co-integrating finFETs of two semiconductor material types, e.g., Si and SiGe, on a bulk substrate is described. Fins for finFETs may be formed in an epitaxial layer of a first semiconductor type, and covered with an insulator. A portion of the fins may be removed to form voids in the insulator, and the voids may be filled by epitaxially growing a semiconductor material of a second type in the voids. The co-integrated finFETs may be formed at a same device level.

18 Claims, 7 Drawing Sheets

METHOD TO CO-INTEGRATE SIGE AND SI CHANNELS FOR FINFET DEVICES

BACKGROUND

Technical Field

The technology relates to methods and structures for making co-integrated SiGe and Si finFETs on bulk semiconductor wafers.

Discussion of the Related Art

Transistors are fundamental device elements of modern digital processors and memory devices, and have found applications in high-power electronics. Currently, there are a variety of transistor designs or types that may be used for different applications. Various transistor types include, for example, bipolar junction transistors (BJT), junction field-effect transistors (JFET), metal-oxide-semiconductor field-effect transistors (MOSFET), vertical channel or trench field-effect transistors, and superjunction or multi-drain transistors. One type of transistor that has emerged within the MOSFET family of transistors is a fin field-effect transistor (finFET).

An example of a finFET 100 is depicted in the perspective view of FIG. 1. A finFET may be fabricated on a bulk semiconductor substrate 110, e.g., a silicon substrate, and comprise a fin-like structure 115 that runs in a length direction along a surface of the substrate and extends in a height direction normal to the substrate surface. The fin 115 may have a narrow width, e.g., less than 250 nanometers. There may be an insulating layer 105, e.g., an oxide layer, on a surface of the substrate. The fin may pass through the insulating layer 105. A gate structure comprising a conductive gate material 130 and gate insulator 135 may be formed over a region of the fin. Upper portions of the fin may be doped on either side of the gate structure to form a source region 120 and drain region 140 adjacent to the gate.

FinFETs have favorable electrostatic properties for complimentary MOS scaling to smaller sizes. Because the fin is a three-dimensional structure, the transistor's channel can be formed on three surfaces of the fin, so that the finFET can exhibit a high current switching capability for a given surface area occupied on substrate. Since the channel and device can be raised from the substrate surface, there can be reduced electric field coupling between adjacent devices as compared to conventional planer MOSFETs.

SUMMARY

The described technology relates to methods and structures for making co-integrated SiGe and Si finFETs on a bulk substrate. Some integrated circuits may benefit from having finFET transistors of a first conductivity type, e.g., n-type, fabricated from Si semiconductor material and having finFET transistors of a second conductivity type, e.g., p-type, fabricated from SiGe semiconductor material. Methods and structures for forming Si an SiGe finFETs on a same substrate at a same device level are described.

According to some embodiments, a method for making co-integrated finFETs may comprise forming a plurality of fins of a first semiconductor material for finFETs of a first type, removing a portion of the plurality of fins to form voids, and filling the voids with a second semiconductor material to form fins for finFETs of a second type. The first semiconductor material may comprise SiGe, for example, and the second semiconductor material may comprise Si that has no Ge. The Si and SiGe may be epitaxially grown and doped in some applications to provide a desired conductivity type. For example, the SiGe material may be doped to provide p-type conductivity, and the Si material may be doped to provide n-type conductivity. By removing a portion of the fins and refilling the voids by epitaxial growth, two types of finFETs with high-quality semiconductor material may be formed at a same level on a substrate and may have fins of approximately the same top height and width.

Also contemplated are integrated circuits that include co-integrated finFETs of two material types. In some embodiments, an integrated circuit having co-integrated finFETs of first and second types comprises a first epitaxially-grown fin for a finFET of a first semiconductor type registered to a substrate at a first device level, and a second epitaxially-grown fin for a finFET of a second semiconductor type registered to the substrate at the first device level. The first epitaxially-grown fin may be for a SiGe finFET and the second epitaxially-grown fin may be for a Si finFET. In some implementations, the first epitaxially-grown fin is for a p-type finFET and the second epitaxially-grown fin is for an n-type finFET. According to some embodiments, the first epitaxially-grown fin and the second epitaxially-grown fin may have approximately a same width and approximately a same top height.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

The features and advantages of the embodiments will become more apparent from the detailed description set forth below when taken in conjunction with the drawings.

DETAILED DESCRIPTION

Figure 1:
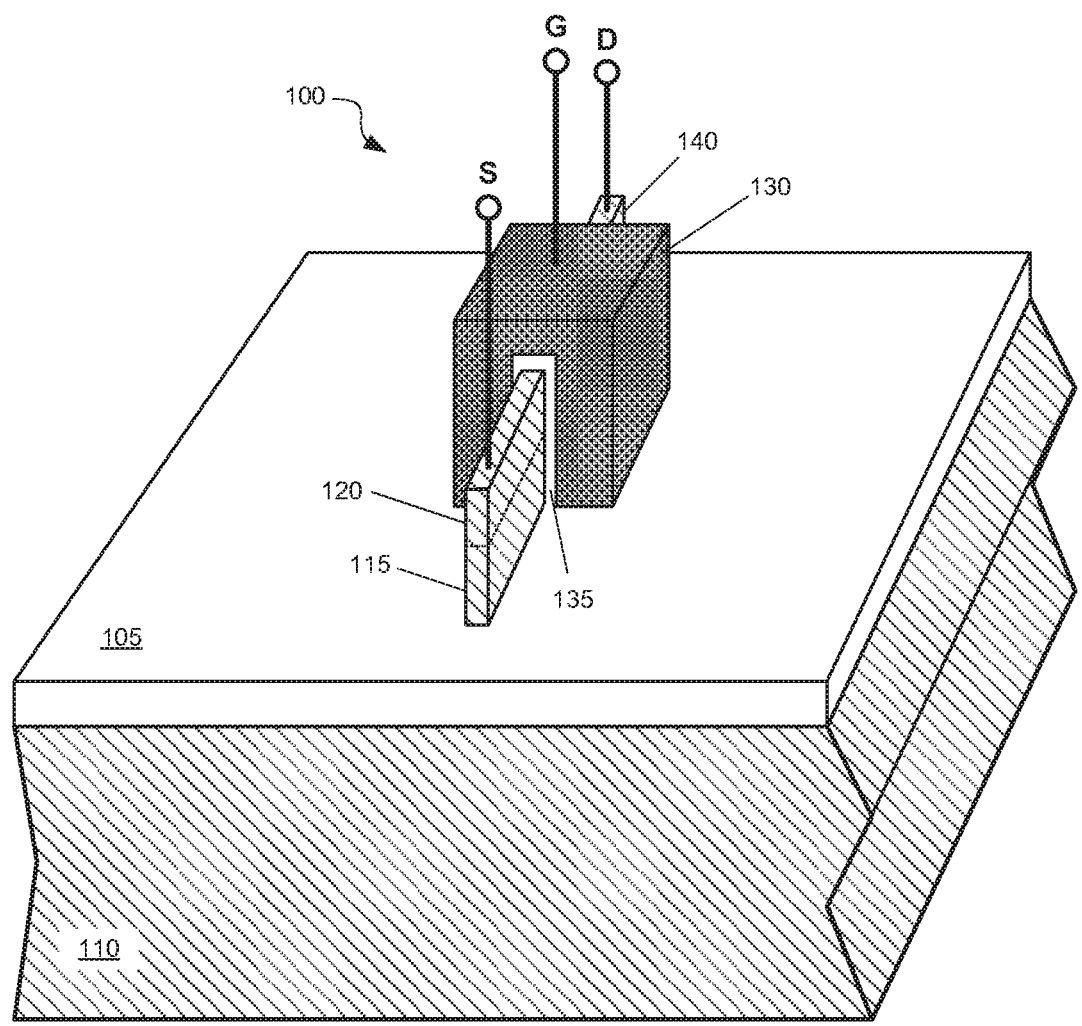
FIG. 1 is a perspective view of a finFET formed on a bulk substrate.

As noted above, finFETs exhibit favorable current-to-size switching capabilities for integrated circuits, and finFETs like those shown in FIG. 1 have been fabricated in high density on bulk silicon (Si) substrates. In some applications (e.g., high-frequency, heterojunction device, band-gap tuning, or mixed signal applications), it may be desirable to fabricate finFETs from silicon-germanium (SiGe) semiconductor material on a same bulk Si substrate on which Si-based finFETs are fabricated. The co-integration of SiGe may allow band-gap tuning of devices in the circuit, and may allow integration with high-speed heterojunction devices. An integrated circuit that co-integrates SiGe- and Si-based finFETs may be used for a broad range of high-frequency (e.g., multi-gigahertz) applications.

There have been several approaches to co-integration of SiGe and Si finFETs on bulk Si substrates. One approach utilizes local ion implantation of Ge into a Si substrate, which can adjust a threshold voltage Vth for pFET devices. However, there are two undesirable results associated with this approach. A first is that the implantation of the Ge ions can locally damage the substrate, which leads to degraded device performance. A second result is that the Ge concentration is non-uniform in the device.

Another approach is to selectively grow SiGe by epitaxy only in zones designated for pFET devices. Although this approach provides a better quality SiGe material, there results a substantial difference in topology for the SiGe and Si finFET devices. Significant topology can make subsequent patterning and alignment difficult. Although the topology may be improved using anisotropic reactive-ion etching (RIE) techniques, the etching adds more complexity and cost to the process. Additionally, both approaches (ion-implantation or epitaxy) require stringent overlay alignment steps for photolithography.

FIGS. 2A-2K depict process steps that may be used to fabricate co-integrated SiGe and Si finFET devices on a same bulk semiconductor substrate. In overview, fins are formed in a blanket SiGe epitaxial layer on a bulk Si substrate. Some of the fins are retained for fabricating p-type SiGe finFET devices. Some of the fins are removed and replaced with epitaxially grown Si fins for fabricating n-type Si finFET devices. The SiGe and Si finFET devices may be formed at a same device level.

According to some embodiments, a method for fabricating co-integrated SiGe and Si finFET devices may comprise obtaining a semiconductor substrate 110 (e.g., a bulk Si substrate) on which a layer of SiGe 220 is expitaxially grown. A hard mask material 230 (e.g., silicon nitride SiN or $Si_3N_4$) may be deposited on the SiGe layer.

The SiGe layer 220 may be epitaxially grown to a thickness between 10 nm and 100 nm in some embodiments, or between 5 nm and 50 nm in some embodiments. In some implementations, the SiGe layer 220 is epitaxially grown to a thickness between 20 nm and 40 nm, and may be approximately 30 nm thick in some embodiments. The hard mask 230 may be deposited to a thickness between 20 nm and 100 nm in some embodiments, and may be between 30 nm and 50 nm in some embodiments. In various embodiments, the thickness of the hard mask is selected to provide etch resistance for at least the duration of an etching of the underlying SiGe layer. For example, some of the hard mask 230 may be removed during etching of the SiGe layer, so that its thickness must be sufficient such that the hard mask will not be entirely removed during the SiGe etching step.

The hard mask 230 may be patterned by photolithography steps and etching, to form mask features 234 for the fins of finFET devices. The mask features may be formed using any suitable process steps. In some embodiments, the mask features 234 may be formed according to an edge transfer process in which spacers on edges of dummy gates provide a pattern for the mask features 234. This patterning technique may be referred to as sidewall or spacer image transfer (SIT). The pattern may be transferred via ME into the hard mask 230.

Regardless of how the mask features 234 are formed, they may be used to define the shape of the fins for finFET devices. The mask features 234 may have a width between 5 nm and 100 nm in some embodiments. In some implementations, the width may be between 5 nm and 50 nm. The width of the mask feature may define a width of the subsequently-etched fins.

Figure 2A:
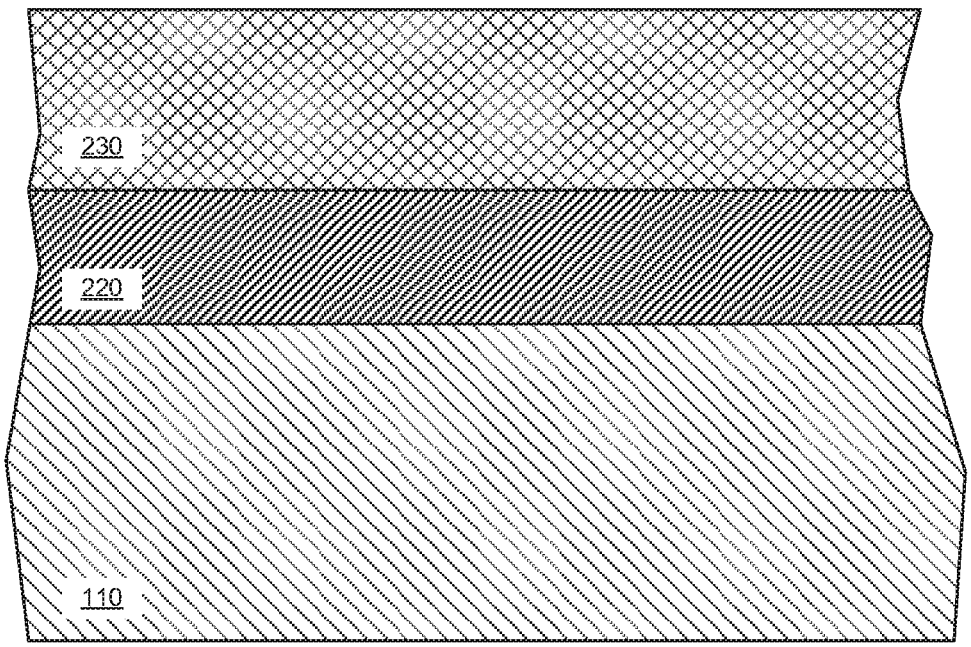
FIGS. 2A-2K depict embodiments of process steps that may be used to form co-integrated SiGe and Si fins for finFET devices.
Figure 2B:
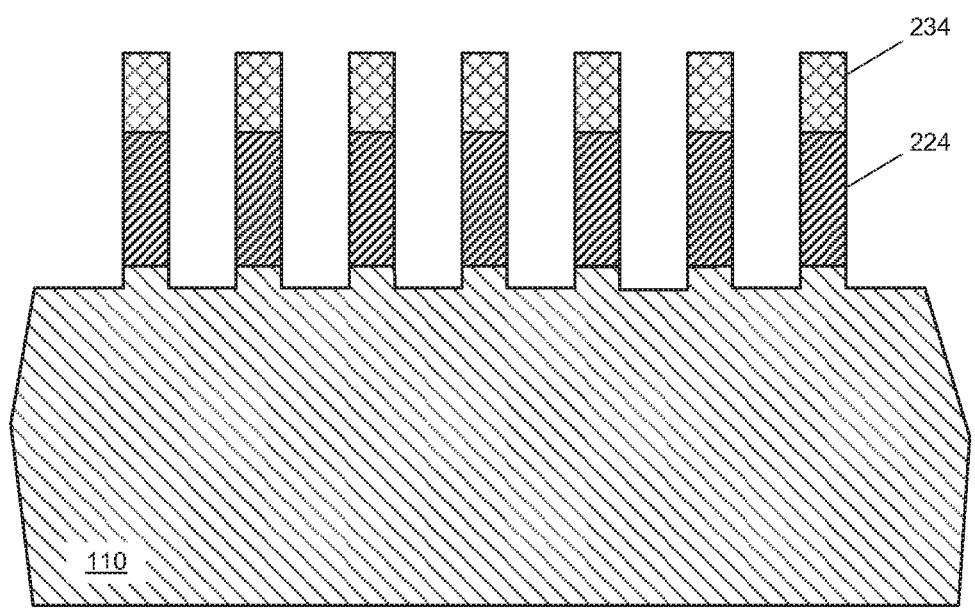

The length of the mask features may be between 30 nm and 2000 nm. A step of reactive-ion etching may be employed to transfer the fin pattern into the underlying SiGe layer 220, so as to form the fins 224, as depicted in FIG. 2B. The ME may stop near the bottom of the fins, e.g., within about ±20 nm of the bottom of the fins. According to some embodiments, the ME may extend beyond the bottom of the fins 224, as depicted in FIG. 2B.

Figure 2C:
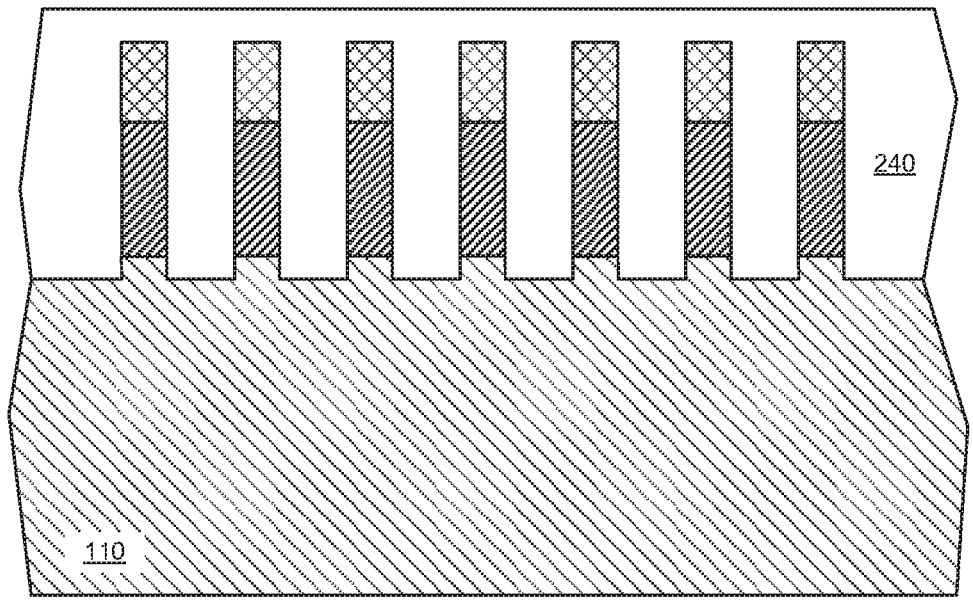

After formation of the fins 224, the surface may be covered with an insulator 240, as depicted in FIG. 2C. Any suitable insulator may be used, e.g., an oxide such as $SiO_2$. In some cases, a spin-on glass may be applied and subsequently baked to form insulator 240. The insulator may be deposited by any suitable method, e.g., spin on, plasma deposition, e-beam evaporation, sputtering, etc.

Figure 2D:
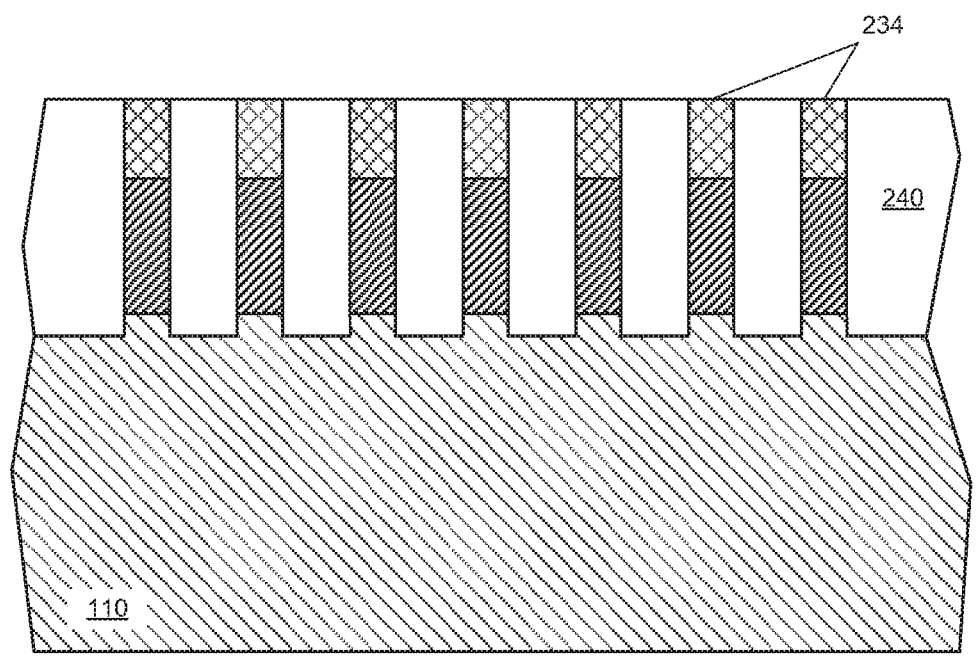

The insulator 240 may be etched back to expose the tops of the mask features 234, as depicted in FIG. 2D. In some embodiments, a timed ME may be used to etch back the insulator 240. In some implementations, chemical-mechanical polishing (CMP) may be used to remove a portion of the insulator 240 above the mask features 234. The CMP may be timed and/or may be selective to removing the insulator 240 and not the mask features 234, so that the CMP stops on the mask features 234.

Figure 2E:
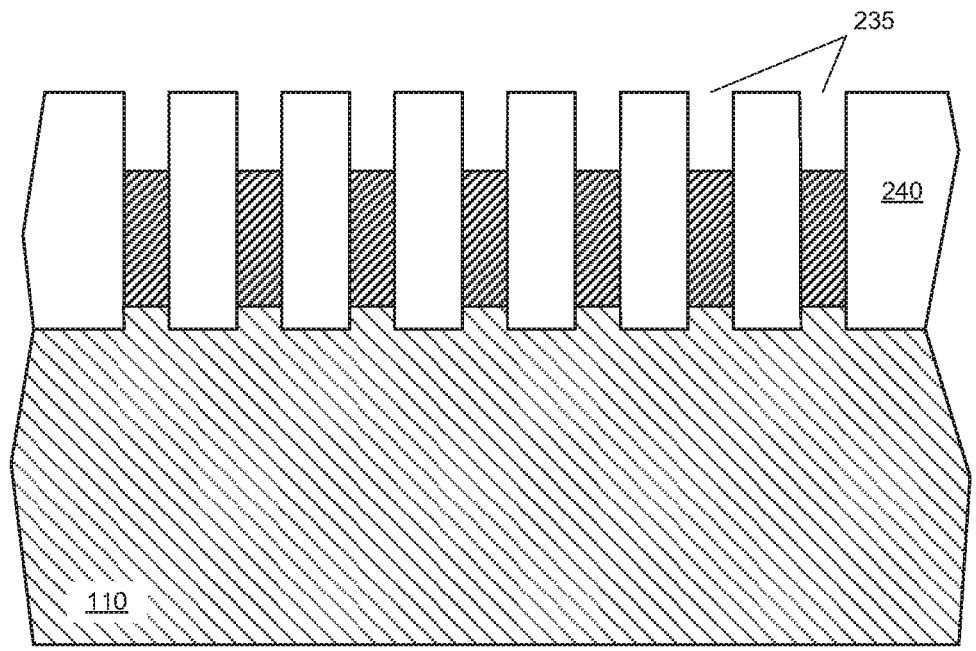

The mask features 234 may be removed using a selective wet or dry etch that removes the material (e.g., $Si_3N_4$) of the mask features, but does not appreciably remove the fin material (e.g., SiGe) or insulator 240 (e.g., $SiO_2$). According to some embodiments, a hot phosphoric acid etch may be used to remove the mask features 234, leaving troughs 235, as depicted in FIG. 2E.

Figure 2F:
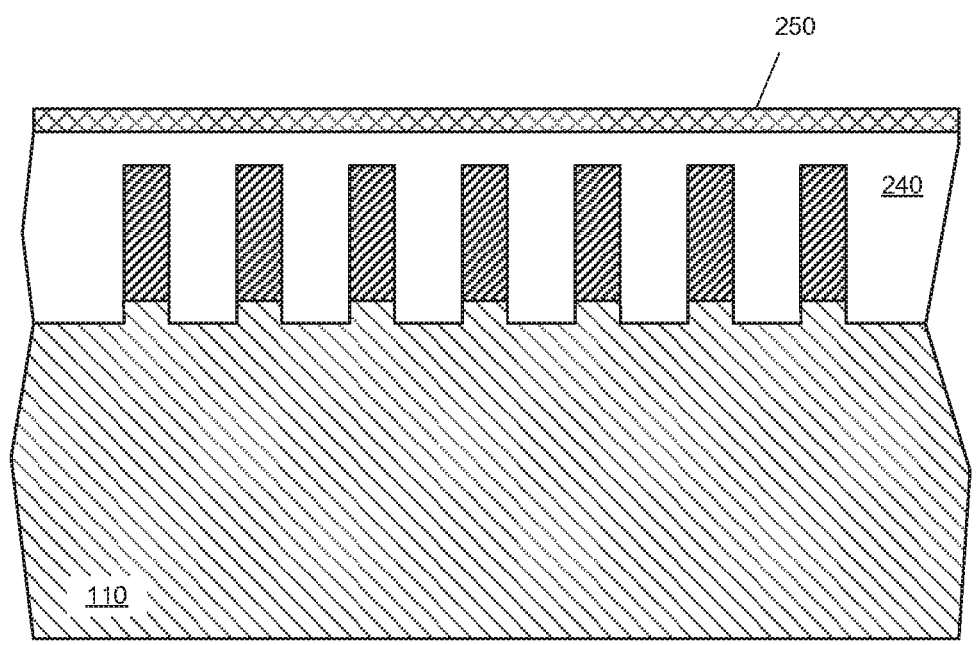

The troughs 235 may be overfilled with an additional deposition of insulating material 240. The amount of insulator deposited may be enough to fill the troughs 235 plus an additional 10 nm to 100 nm above the level of the fins. The resulting structure may have a variegated surface topology, and may be subjected to a CMP step to planarize the surface. The insulator may be polished back to a distance between 5 nm and 50 nm from the top surface of the fins, in some embodiments. A second hard mask layer 250 may then be deposited over the structure, as depicted in FIG. 2F. The thickness of the hard mask layer 250 may be between 10 nm and 100 nm, in some embodiments.

Figure 2G:
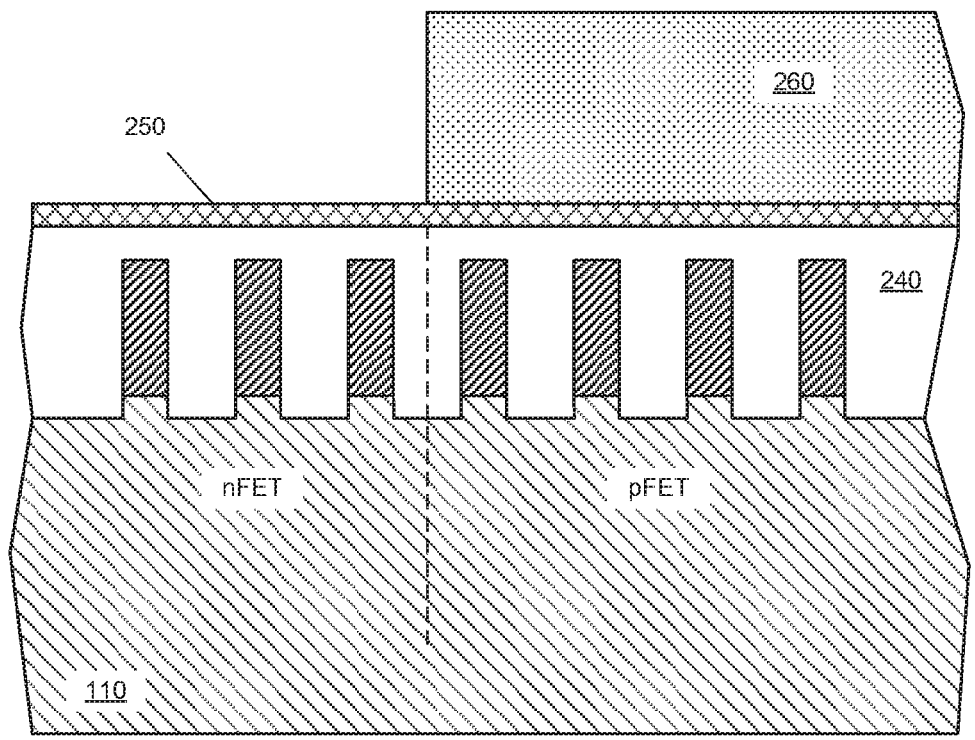
Figure 2H:
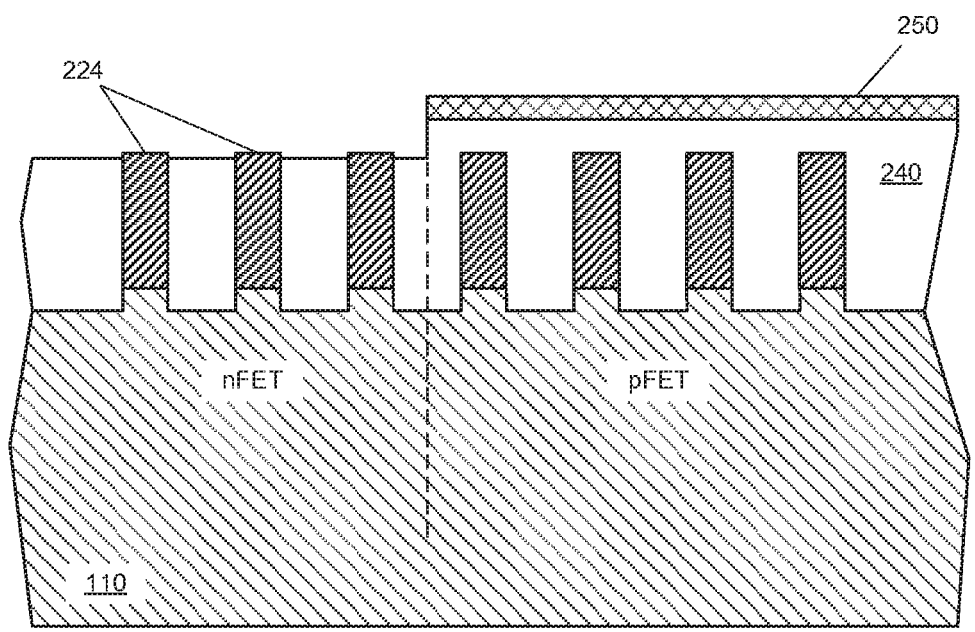

Referring to FIG. 2G, a photolithography step may then be employed to pattern a photoresist 260 over at least a portion of the fins. The photoresist may be used to define regions where p-type finFETs will be formed. Regions without the photoresist may define where n-type finFETs will be formed. In the regions without the photoresist 260, the hard mask layer 250 is exposed and subsequently etched away to expose the underlying insulator 240. After the insulator 240 is exposed in the nFET region, the photoresist 260 may be stripped from the substrate. Any suitable process may be used to strip the photoresist. According to some embodiments, the photoresist may be stripped using an oxygen plasma isotropic etch. In some implementations, the photoresist may be stripped using a chemical bath.

Figure 2I:
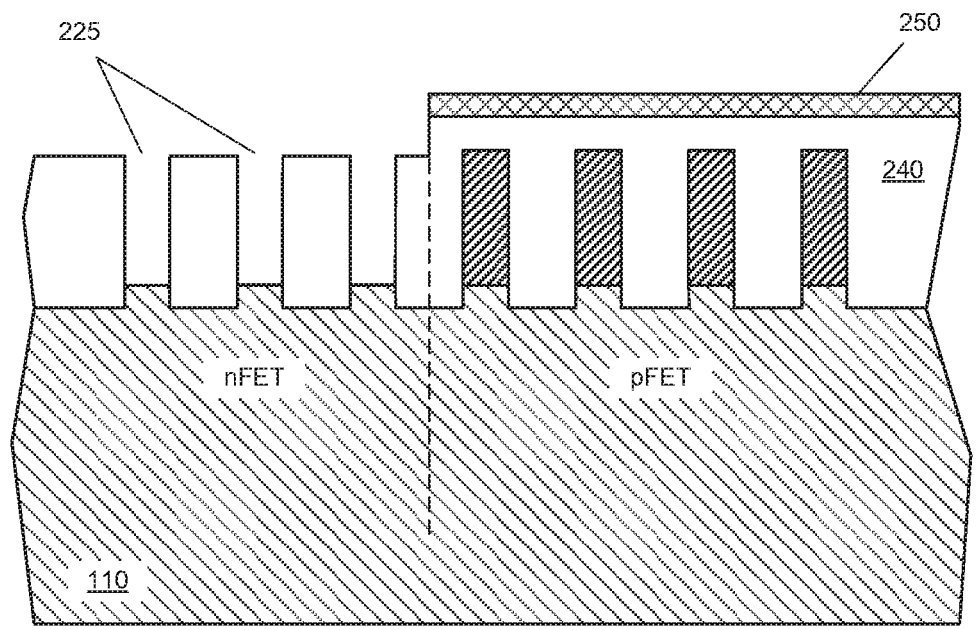

The insulator 240 may then be etched in the open areas in the nFET regions, so as to expose the tops of the fins in those regions, as depicted in FIG. 2I1. The etch may comprise an anisotropic RIE, and may stop within 10 nm after exposing the tops of the fins 224. In some embodiments, the etch may comprise a SiCoNi etch that removes an oxide insulator 240 and any native oxide on the SiGe fins 224. In other embodiments, an RIE step using $CHF_3$ may be used to remove the oxide 240. In some embodiments, the etch may be timed to stop at a level approximately equal with the tops of the fins. In some implementations, the etch may be timed to stop at a pre-selected level below the tops of the fins, e.g., 5 nm below the tops of the fins.

According to some embodiments, the exposed fins may be removed by a wet or dry etch, as depicted in FIG. 2I. In some implementations, a wet hydrochloric (HCl) acid etch step is used to remove the SiGe fins 224, and leave fin troughs or voids 225. Adjacent the voids 225 is insulating material 240 that may subsequently serve as a guide for the formation of fins.

Figure 2J:
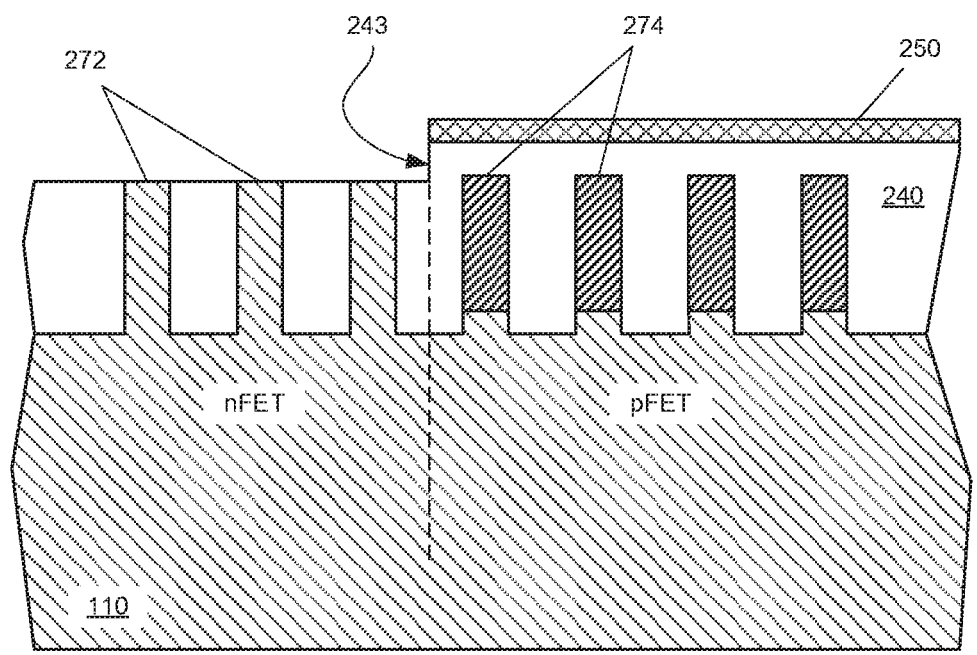

As depicted in FIG. 2J, Si fins 272 may be formed in the fin voids 225 by epitaxial growth. The Si fins register to the underlying Si substrate 110 when they begin growing by epitaxy, and therefore provide high-quality crystallographic Si fins. The fin shape may be guided by the insulator, so that the epitaxially grown fins are the same width as the fins that were removed. The epitaxial growth may be timed so that the Si fins 272 grow to approximately the same height as the nearby SiGe fins 274.

Figure 2K:
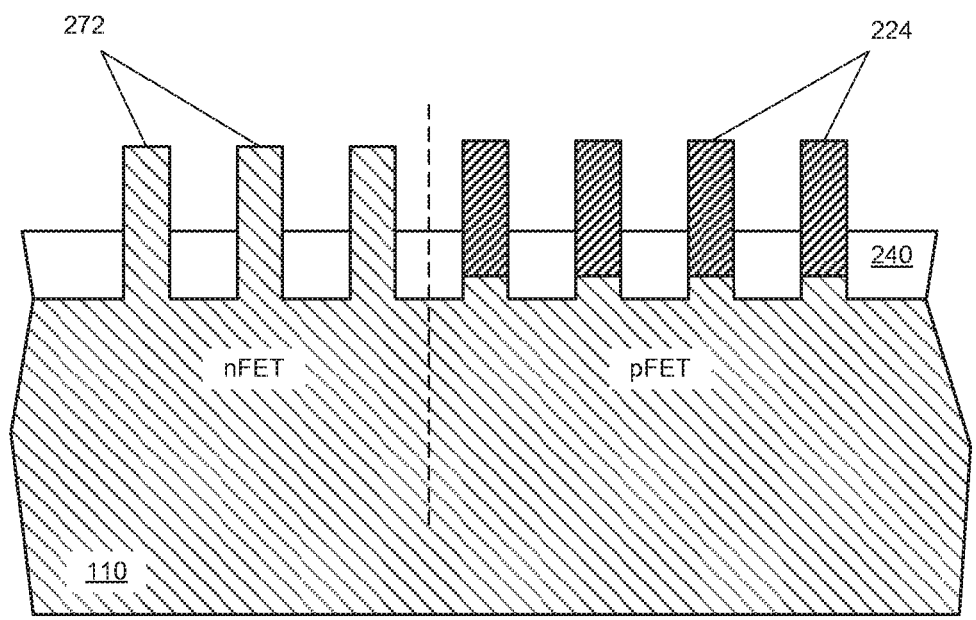

The remaining hard mask layer 250 may be removed, and the insulator 240 etched back over the SiGe fins 274. In some embodiments, a photopatterning step, inverse to that shown in FIG. 2G, may be used to remove the remaining hard mask layer 250 and etch back the insulator 240, to an approximately uniform height across the substrate 110. In some implementations, a wet etch comprising hydrofluoric acid and ethylene glycol (HFEG) may be used. The wet etch may remove thermal oxide and silicon nitride at approximately a same rate. According to some embodiments, a CMP step may be used to remove the hard mask layer 250 and insulator, and to planarize the fins and insulator 240. Regardless of how the hard mask layer 250 and insulator 240 are removed from the top of the fins, a SiCoNi etch step may be used to etch the insulator 240 back further from the tops of the fins to expose the Si and SiGe fins, as depicted in FIG. 2K. The height of the fins above the oxide surface may be between 50% and 100% of the height of the SiGe fins 274.

Once the fins are exposed, the substrate and fin structures may be subjected to standard finFET processing steps to form single-fin or multi-fin FETs on the substrate. A single-fin FET may appear like that shown in FIG. 1. A multi-fin FET may have multiple fins per gate structure. In various embodiments, the Si finFETs and SiGe finFETs that are formed according to the embodiments of FIGS. 2A-2K comprise high-quality crystalline semiconductor materials formed at a same device level on the substrate. Accordingly n-type Si finFETs and p-type SiGe finFETs of quality, epitaxial semiconductor material may be formed at a same level for an integrated circuit. The fins of the Si finFETs and SiGe finFETs may be of approximately the same width and have an approximately same top height above the substrate 110. As used herein, "approximately" may mean within ±20% of an overall height in some embodiments, within ±10% of an overall height in some embodiments, within ±5% of an overall height in some embodiments, and yet within ±2% of an overall height in some embodiments.

Although the processing steps depicted in FIGS. 2A-2K illustrate one method for forming Si and SiGe finFETs, in other embodiments, there may be additional steps or fewer steps. According to some embodiments, the step 243 in the insulator 240 that appears in FIG. 2J may only occur in limited regions of a wafer or substrate 110. The step 243 may be removed by a chemical-mechanical polishing (CMP) process, so as to planarize the insulator 240. Accordingly, an photopatterning step that is inverse to that shown in FIG. 2G may not be used.

In some implementations, a CMP step may be used prior to forming a hard mask 250 in FIG. 2F. The CMP step may planarize the insulator to be approximately equal to the height of the fin structures. The hard mask may be formed on the substrate at approximately the height of the fin structures. After the Si fins are grown, the hard mask 250 may be removed to yield a structure with approximately uniform insulator thickness across the Si fin and SiGe fin regions. The fins may be of approximately the same height.

In some cases, the SiGe and Si fins may be grown to heights in excess of a final device height. Subsequently, the insulator 240 and fin structures may all be etched back, e.g., by CMP, to yield SiGe and Si fins of approximately the same height in an insulator 240 that extends to the top of the fins. A subsequent selective etch may be used to etch the insulator 240 back to expose the fins and yield a structure like that shown in FIG. 2K.

The fins shown in the drawings may be spaced laterally from each other on one or more regular spacing intervals. For example, there may be a uniform lateral spacing $d_1$ between all fins. Alternatively, there may be two uniform lateral spacings $d_1$, $d_2$ alternating between successive fins.

The processes described in FIGS. 2A-2K may be applied, in some implementations, to other material combinations, e.g., SiC—Si, SiC—SiGe, GaAs—AlGaAs, etc. Additionally, the processes may not be limited to co-integrating only two types of finFETs. In some implementations, a third type of finFET may be co-integrated by repeating the steps indicated by FIGS. 2G-2J for a second portion of the SiGe fins prior to performing steps associated with FIG. 2K.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device, comprising:
   a silicon substrate having a surface;
   a pFET fin whose semiconductor portions consist of a first portion extending outward from the surface of the substrate to a first height and a second portion extending outward from the first portion to a second height, the first portion consisting silicon and the second portion consisting of SiGe; and
   an nFET fin extending outward from the surface of the substrate to a third height that is greater than the first height, semiconductor portions of the nFET fin consisting of silicon;
   at least one gate on the pFET and nFET fins.

2. The device of claim 1, wherein the second portion has a length and a width the same as the first portion.

3. The device of claim 1, wherein the pFET fin has a top surface coplanar with a top surface of the nFET fin.

4. The device of claim 1, further comprising an insulator over the surface of the substrate and between the pFET fin and the nFET fin.

5. The device of claim 4, wherein the insulator includes an oxide or a spin-on glass.

6. A device, comprising:
   a substrate having a surface;
   a pFET fin whose semiconductor portions consist of a first portion extending from the surface of the substrate and a second portion extending from the first portion, the first portion of the pFET fin consisting of silicon and the second portion of the pFET fin consisting of SiGe; and
   an nFET fin whose semiconductor portions consist of a first portion extending from the surface of the substrate and a second portion extending from the first portion, the first portion of the nFET fin consisting silicon and the second portion of the nFET fin consisting of silicon epitaxially grown over the first portion of the nFET fin.

7. The device of claim 6, wherein the substrate consists of silicon.

8. The device of claim 6, wherein the pFET fin and the nFET fin have a same height.

9. The device of claim 6, further comprising at least one gate overlying the pFET fin and the nFET fin, the at least one gate being transverse to the pFET fin and the nFET fin.

10. The device of claim 6, wherein the second, SiGe portion of the pFET fin is epitaxially grown over the first portion of the pFET fin.

11. The device of claim 6, wherein the second, SiGe portion of the pFET fin is doped to provide p-type conductivity.

12. The device of claim 6, wherein the second, silicon portion of the nFET fin is doped to provide n-type conductivity.

13. The device of claim 6, further comprising at least one gate overlying the pFET fin and the nFET fin, the at least one gate being transverse to the pFET fin and the nFET fin, wherein:
   the substrate consists of silicon;
   the pFET fin and the nFET fin have a same height;
   the second, SiGe portion of the pFET fin is epitaxially grown over the first portion of the pFET fin;
   the second, SiGe portion of the pFET fin is doped to provide p-type conductivity; and
   the second, silicon portion of the nFET fin is doped to provide n-type conductivity.

14. The device of claim 1, wherein the second, SiGe portion of the pFET fin is epitaxially grown over the first portion of the pFET fin.

15. The device of claim 1, wherein an upper portion of silicon of the nFET fin is epitaxially grown over a lower portion of the nFET fin.

16. The device of claim 1, wherein the second, SiGe portion of the pFET fin is doped to provide p-type conductivity.

17. The device of claim 1, wherein the silicon of the nFET fin is doped to provide n-type conductivity.

18. The device of claim 1, further comprising an insulator over the surface of the substrate and between the pFET fin and the nFET fin, wherein:
   the second portion has a length and a width the same as the first portion;
   the pFET fin has a top surface coplanar with a top surface of the nFET fin;
   the insulator includes an oxide or a spin-on glass;
   the second, SiGe portion of the pFET fin is epitaxially grown over the first portion of the pFET fin;
   an upper portion of silicon of the nFET fin is epitaxially grown over a lower portion of the nFET fin;
   the second, SiGe portion of the pFET fin is doped to provide p-type conductivity; and
   the silicon of the nFET fin is doped to provide n-type conductivity.

* * * * *